United States Patent
Lee et al.

(10) Patent No.: US 7,173,288 B2
(45) Date of Patent: Feb. 6, 2007

(54) NITRIDE SEMICONDUCTOR LIGHT EMITTING DEVICE HAVING ELECTROSTATIC DISCHARGE (ESD) PROTECTION CAPACITY

(75) Inventors: Kyu Han Lee, Kyungki-do (KR); Hyun Kyung Kim, Kyungki-do (KR); Je Won Kim, Kyungki-do (KR); Dong Joon Kim, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 165 days.

(21) Appl. No.: 11/053,906

(22) Filed: Feb. 10, 2005

(65) Prior Publication Data

US 2006/0060880 A1 Mar. 23, 2006

(30) Foreign Application Priority Data

Sep. 17, 2004 (KR) .............. 10-2004-0074656

(51) Int. Cl.
*H01L 29/22* (2006.01)
(52) U.S. Cl. .................... 257/94; 257/96; 257/471
(58) Field of Classification Search ............ 257/80, 257/82, 88, 94, 96, 449, 471
See application file for complete search history.

(56) References Cited

U.S. PATENT DOCUMENTS 5,914,501 A 6/1999 Antle et al.
6,593,597 B2 7/2003 Sheu
6,911,676 B2* 6/2005 Yoo .................... 257/93
7,064,353 B2* 6/2006 Bhat ................... 257/79
7,105,860 B2* 9/2006 Shei et al. ............ 257/99
2002/0028527 A1* 3/2002 Maeda et al. ......... 438/29
2003/0122139 A1* 7/2003 Meng et al. .......... 257/81
2005/0167680 A1* 8/2005 Shei et al. ............ 257/79

FOREIGN PATENT DOCUMENTS

WO WO 2005/124880 * 12/2005

* cited by examiner

*Primary Examiner*—Sara Crane
(74) *Attorney, Agent, or Firm*—Lowe Hauptman & Berner, LLP.

(57) ABSTRACT

A nitride semiconductor light emitting device including a light emitting diode and a diode formed on a single substrate, in which the light emitting diode and the diode use a common electrode. According to the present invention, an active layer and a p-type nitride semiconductor layer are each divided into a first region and a second region by an insulative isolation layer, and an ohmic contact layer is formed on the p-type nitride semiconductor layer contained in the first region. A p-type electrode is formed on the ohmic contact layer and is extended to the p-type nitride semiconductor layer contained in the second region. An n-type electrode is formed on the p-type nitride semiconductor layer contained in the second region, passes through the p-type nitride semiconductor layer and the active layer contained in the second region, and is connected to the first n-type nitride semiconductor layer.

7 Claims, 8 Drawing Sheets

PRIOR ART

NITRIDE SEMICONDUCTOR LIGHT EMITTING DEVICE HAVING ELECTROSTATIC DISCHARGE (ESD) PROTECTION CAPACITY

RELATED APPLICATIONS

The present application is based on, and claims priority from, Korean Application Number 2004-74656, filed Sep. 17, 2004, the disclosure of which is incorporated by reference herein in its entirety.

BACKGROUND OF THE INVENTION

1. Field of the Invention

The present invention relates to a nitride semiconductor light emitting device, and more particularly to a nitride semiconductor light emitting device including a light emitting diode and a diode that are formed on a single substrate, which allows the light emitting diode and the diode to use a common electrode, so that it prevents the light emitting diode from being damaged by static electricity, and reduces the size of an overall device and the number of necessary electrodes.

2. Description of the Related Art

In recent times, nitride semiconductors have been introduced, which use a nitride such as GaN, and have excellent physical and chemical characteristics so that they are increasingly popular as a core material of a photoelectric or electronic element. Particularly, the nitride semiconductor light emitting diode is capable of emitting light of a variety of wavelengths, for example, green, blue, and ultraviolet. As individual brightness of the above-mentioned light wavelengths is rapidly increased due to the increasing development of associated technology, nitride semiconductor light emitting diodes have recently been applied to a variety of technical fields, for example, natural-colored electronic display boards and illumination systems, etc.

The nitride semiconductor light emitting diode has a disadvantage in that it has very weak resistance to static electricity as compared to other compound semiconductors such as GaP or GaAlAs. For example, the nitride semiconductor light emitting diode may be damaged by a forward constant voltage of several hundreds of volts (e.g., 100V), and may also be damaged by a reverse constant voltage of several tens of volts (e.g., 30V). Nitride semiconductor light emitting diodes are very vulnerable to the above-mentioned constant-voltages and may be damaged thereby when they are handled. Therefore, many developers have conducted intensive research into a variety of technologies capable of obviating the above-mentioned problem of the nitride semiconductor light emitting diode. A representative example of such technologies has been disclosed in U.S. Pat. No. 6,593,597, entitled "GROUP III–V ELEMENT-BASED LED ESD PROTECTION CAPACITY", by South Epitaxy Corporation, which is incorporated herein by reference. The U.S. Pat. No. 6,593,597 shows a nitride semiconductor light emitting device in which a light emitting diode and a diode are simultaneously formed on a single substrate.

Figure 1:
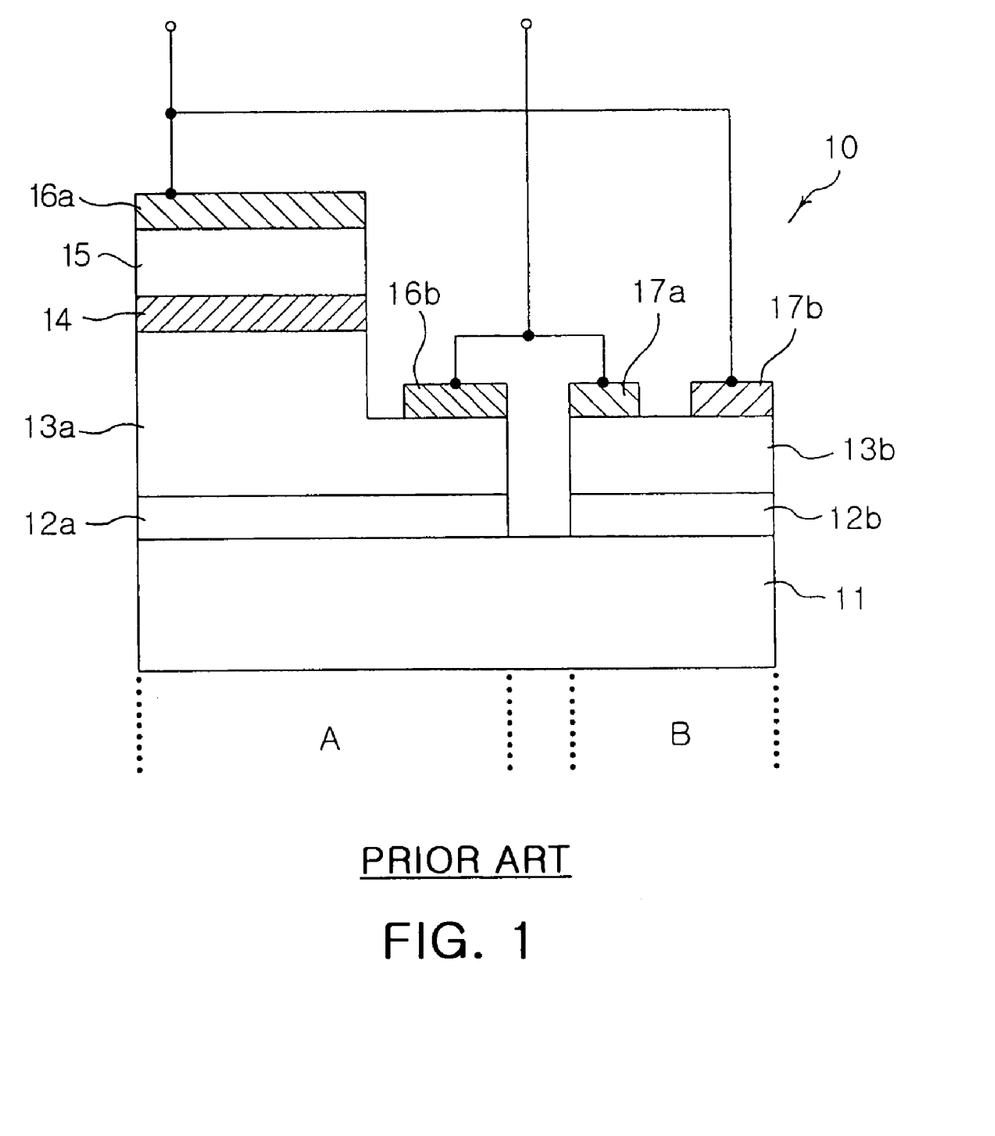
FIG. 1 is a cross-sectional view illustrating a conventional nitride semiconductor light emitting diode (LED) having electrostatic discharge (ESD) protection capacity.

FIG. 1 is a cross-sectional view illustrating a light emitting diode (LED) shown in the above-mentioned U.S. Pat. No. 6,593,597. As shown in FIG. 1, the conventional LED 10 for preventing static electricity from being generated (hereinafter referred to as an electrostatic discharge (ESD) protection diode) forms an LED unit A and a diode unit B on a single substrate. The LED unit A sequentially forms a buffer layer 12, an n-type nitride semiconductor layer 13a, an active layer 14, a p-type nitride semiconductor layer 15 on a substrate 11. A p-type electrode 16a is formed on the p-type nitride semiconductor layer 15. An n-type electrode 16b is formed on the exposed n-type nitride semiconductor layer 13a. The diode unit B forms two electrodes 17a and 17b on the n-type nitride semiconductor layer 13b, and allows a single electrode 17a of said two electrodes 17a and 17b to form a Schottky contact with the n-type nitride semiconductor layer, such that a Schottky diode is implemented.

The above-mentioned electrostatic discharge (ESD) protection LED 10 implements each of the LED unit A and the diode B on the substrate 11, such that it has a disadvantage in that it unavoidably increases its own overall size as compared to the size of a general nitride semiconductor light emitting device.

The LED unit A requires two electrodes 16a and 16b to provide an electrical connection, and the diode unit B requires two electrodes 17a and 17b to provide an electrical connection, such that the number of electrodes is unavoidably increased, and each electrode must require wire bonding when being connected to an external circuit. Indeed, the nitride semiconductor light emitting diode has a very small size, so that the wire bonding of each electrode is considered to be very difficult. Four wire bonding processes must be carried out in a narrow area, such that a short-circuit may unexpectedly occur between individual wires.

The above-mentioned electrostatic discharge (ESD) protection LED 10 has a further disadvantage in that all the four lead patterns respectively connected to terminals must be formed on a single submount in the case of using a flipchip-structured light emitting device.

SUMMARY OF THE INVENTION

Therefore, the present invention has been made in view of the above problems, and it is an object of the invention to provide a nitride semiconductor light emitting device for simultaneously implementing a light emitting diode and a diode on a single substrate to solve the problem of the nitride semiconductor light emitting diode vulnerable to static electricity, and minimizing the increase of its overall size and the number of all necessary electrodes.

In accordance with the present invention, these objects are accomplished by providing a nitride semiconductor light emitting device, comprising: a first n-type nitride semiconductor layer formed on a substrate; an active layer and a p-type nitride semiconductor layer which are sequentially formed on the first n-type nitride semiconductor layer, are each divided into a first region and a second region by an insulative isolation layer; an ohmic contact layer formed on the p-type nitride semiconductor layer contained in the first region; a p-type electrode which is formed on the ohmic contact layer, and is extended to the p-type nitride semiconductor layer contained in the second region; and an n-type electrode which is spaced apart from the p-type electrode, is formed on the p-type nitride semiconductor layer contained in the second region, passes through the p-type nitride semiconductor layer and the active layer contained in the second region, and is connected to the first n-type nitride semiconductor layer.

Preferably, the p-type nitride semiconductor layer formed on the second region and the p-type electrode form a Schottky junction therebetween, so that they act as a Schottky diode. In order to form the Schottky junction, the p-type electrode has a work function less than that of the p-type nitride semiconductor layer. A representative material capable of being used as the p-type electrode because it has a work function less than that of the p-type nitride semiconductor layer is selected from among a group comprised of Ti, Cr, Al, Cu, and Au.

Preferably, the nitride semiconductor light emitting device may further include a second n-type nitride semiconductor layer additionally formed between the p-type nitride semiconductor layer of the second region and the p-type electrode. The p-type nitride semiconductor layer of the second region and the second n-type nitride semiconductor layer form a pn-junction, so that they act as a pn-diode. Preferably, the second nitride semiconductor layer is designed to have a thickness of 50 nm~200 nm.

Also, the nitride semiconductor light emitting device is designed to be suitable for a flipchip-structured light emitting device. Preferably, in order to apply the nitride semiconductor light emitting device to the flipchip-structured light emitting device, the ohmic contact layer may be indicative of a high-reflection ohmic contact layer having a reflection factor of more than 70%. In order to allow the ohmic contact layer to have the reflection factor of more than 70%, the ohmic contact layer may include at least one layer made of a material selected from among a group comprised of Ag, Ni, Al, Rh, Pd, Ir, Ru, Mg, Zn, Pt, Au, and their combination.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

Figure 2A:
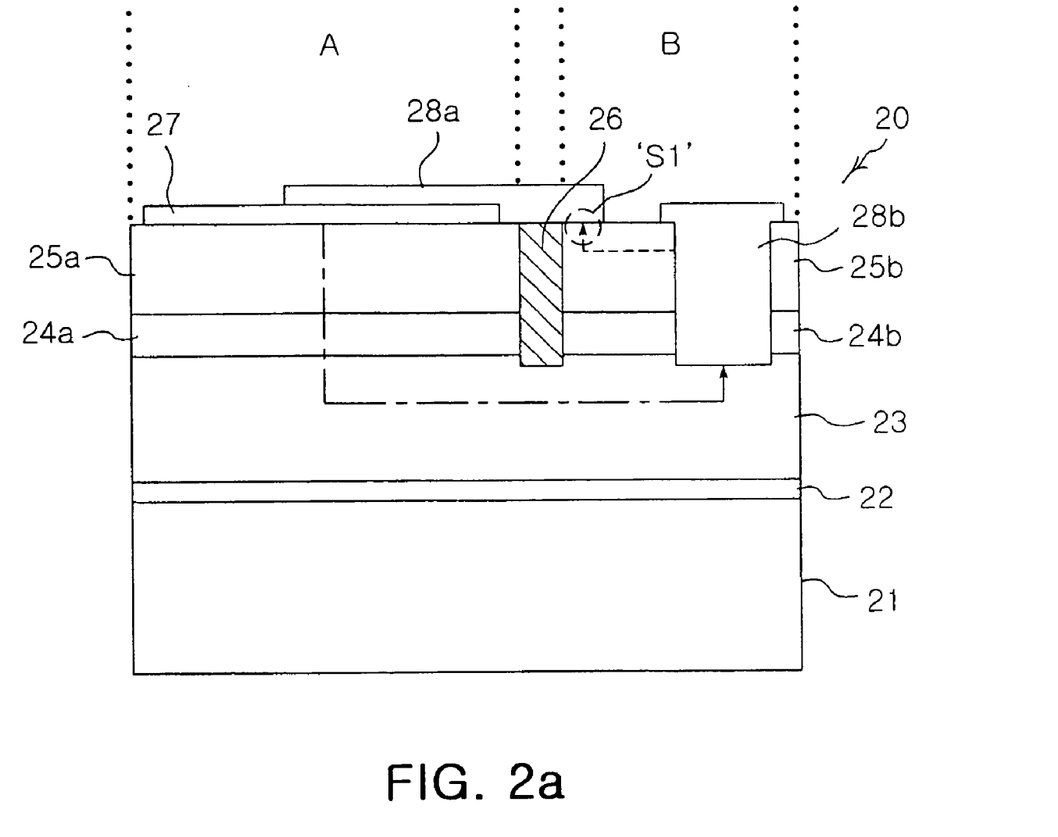
FIG. 2a is a cross-sectional view illustrating a nitride semiconductor light emitting device in accordance with a preferred embodiment of the present invention.
Figure 2B:
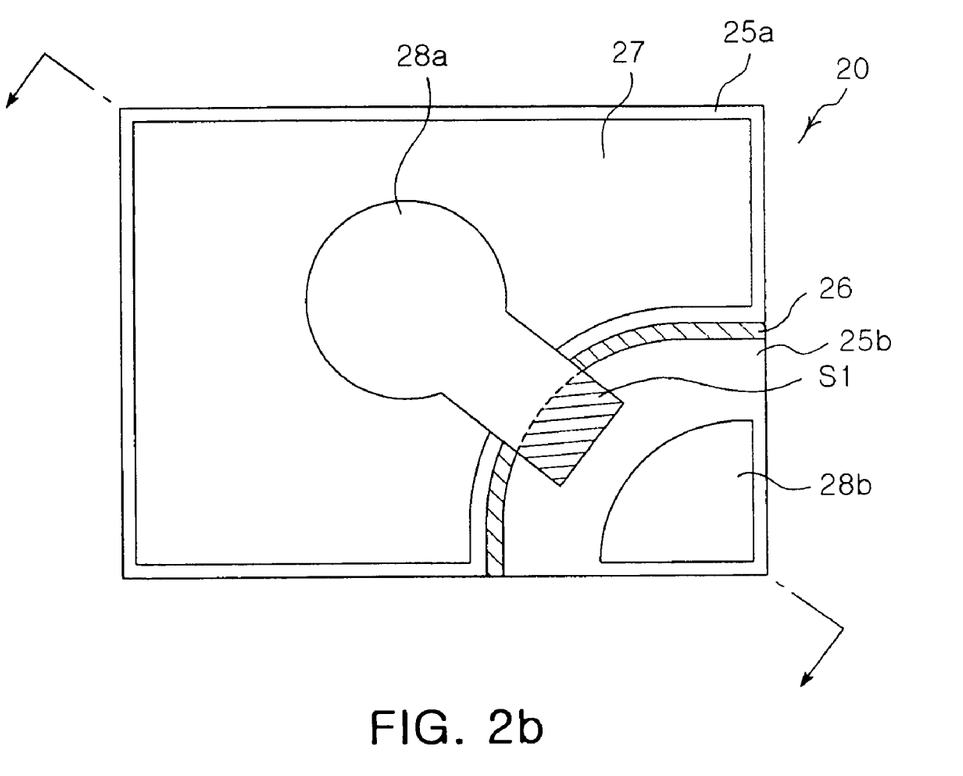
FIG. 2b is a plan view illustrating the nitride semiconductor light emitting device of FIG. 2a in accordance with a preferred embodiment of the present invention.

FIG. 2a is a cross-sectional view illustrating a nitride semiconductor light emitting device in accordance with a preferred embodiment of the present invention. FIG. 2b is a plan view illustrating the nitride semiconductor light emitting device of FIG. 2a. Referring to FIGS. 2a~2b, the nitride semiconductor light emitting device 20 in accordance with a preferred embodiment of the present invention forms a buffer layer 22 on a substrate 21, forms an n-type nitride semiconductor layer 23 on the buffer layer 22, forms active layers 24a and 24b on the n-type nitride semiconductor layer 23, and forms p-type nitride semiconductor light emitting layers 25a and 25b on the active layers 24a and 24b, respectively. The active layers 24a and 24b are isolated from each other by an insulative isolation layer 26, so that the active layer 24a is confined to a first region A and the other active layer 24b is confined to a second region B. Also, the p-type nitride semiconductor layers 25a and 25b are isolated from each other by the insulative isolation layer 26, so that the p-type nitride semiconductor layer 25a is confined to the first region A and the other p-type nitride semiconductor layer 25b is confined to the second region B. The nitride semiconductor light emitting device 20 further includes an ohmic contact layer 27 formed on the p-type nitride semiconductor layer 25a of the first region A; a p-type electrode 28a formed on the ohmic contact layer 27, and extended to the p-type nitride semiconductor layer 25b of the second region B; and an n-type electrode 28b which is formed on the p-type nitride semiconductor layer 25b of the second region B after being disposed apart from the p-type electrode 28a, and is connected to the n-type nitride semiconductor layer 23 after passing through the p-type nitride semiconductor layer 25b and the active layer 24b contained in the second region B.

There is no commercial substrate capable of forming lattice matching between the substrate 21 and nitride semiconductor material, so that a sapphire substrate or a silicon carbide (SiC) substrate may be substituted as the substrate 21. Particularly, the flipchip-structured light emitting device prefers the sapphire substrate to the SiC substrate because the sapphire substrate is transparent. The sapphire substrate is made of a crystal having Hexa-Rhombo R3C symmetricity, and has a variety of planes in the direction of an orientation plane, for example, C(0001) plane, A($1\bar{1}20$) plane, and R($1\bar{1}02$) plane, etc. In the case of the C plane of the above-mentioned sapphire substrate, it is easy for a GaN thin film to be grown on the C plane, and the C plane is stable at high temperatures so that the sapphire substrate is generally substituted as a substrate for a blue- or green-colored light emitting diode.

Typically, a buffer layer 22 may be formed between the substrate 21 and the n-type nitride semiconductor layer 23 to reduce lattice mismatching. A low-temperature nuclear growth layer, such as GaN or AlN, having a thickness of several tens of nanometers (nm) is generally substituted as the buffer layer 22.

The above-mentioned n-type nitride semiconductor layer 23 may be made of an n-type doped semiconductor material of the formula $Al_xIn_yGa_{(1-x-y)}N$ (where $0 \leq x \leq 1$, $0 \leq y \leq 1$, and $0 \leq x+y \leq 1$). A variety of materials may be adapted as the nitride semiconductor material, for example, GaN, AlGaN, and GaInN. Also, a variety of impurities may be adapted as doping materials of the n-type nitride semiconductor layer 23, for example, Si, Ge, Se, Te, or C, etc. The n-type nitride semiconductor layer 23 grows the above-mentioned semiconductor material on the substrate 21 using a variety of well-known deposition methods, for example, an MOCVD (Metal Organic Chemical Vapor Deposition) method, an MBE (Molecular Beam Epitaxy) method, and an HVPE (Hybrid Vapor Phase Epitaxy) method, in such a way that the n-type nitride semiconductor layer 23 can be formed.

The nitride semiconductor light emitting device 20 according to the present invention includes a first active layer 24a and a first p-type nitride semiconductor layer 25a sequentially formed on the first region A, and also includes a second active layer 24b and a second p-type nitride semiconductor layer 25b sequentially formed on the second region B. The first region A and the second region B are separated from each other by an insulative isolation layer.

The first active layer 24a formed on the first region A is adapted to produce or emit light, and is comprised of a nitride semiconductor layer, such as GaN or InGaN, having a multiple-quantum well structure. The first active layer 24a formed on the first region A may be formed on the n-type nitride semiconductor layer 22 using a variety of well-known deposition methods, for example, an MOCVD (Metal Organic Chemical Vapor Deposition) method, an MBE (Molecular Beam Epitaxy) method, and an HVPE (Hybrid Vapor Phase Epitaxy) method.

The second active layer 24b formed on the second layer B is made of the same material as the first active layer 24a formed on the first region A, and is formed by the same process as the first active layer 24a. Indeed, in a fabrication process of a nitride semiconductor light emitting device, the active layers 24a and 24b are deposited as a single active layer on the n-type nitride semiconductor layer 23, and the p-type nitride semiconductor layers 25a and 25b are then deposited as a single p-type nitride semiconductor layer on the single active layer composed of the active layers 24a and 24b. Thereafter, the single active layer composed of the active layers 24a and 24b and the single p-type nitride semiconductor layers composed of the p-type nitride semiconductor layers 25a and 25b are each divided into two regions A and B using a specific process such as an etching process, etc., such that they can be easily formed in the fabrication process of the nitride semiconductor light emitting device.

The p-type nitride semiconductor layer 25a formed on the first region A may be made of a p-type doped semiconductor material of the formula $Al_xIn_yGa_{(1-x-y)}N$ (where $0 \leq x \leq 1$, $0 \leq y \leq 1$, and $0 \leq x+y \leq 1$). A variety of materials may be adapted as the nitride semiconductor material, for example, GaN, AlGaN, and GaInN. Also, a variety of impurities may be adapted as doping materials of the p-type nitride semiconductor layer 25a formed on the first region A, for example, Mg, Zn, or Be, etc. The p-type nitride semiconductor layer 25a grows the above-mentioned semiconductor material on the active layer using a variety of well-known deposition methods, for example, an MOCVD (Metal Organic Chemical Vapor Deposition) method, an MBE (Molecular Beam Epitaxy) method, and an HVPE (Hybrid Vapor Phase Epitaxy) method, in such a way that the p-type nitride semiconductor layer 25a can be formed.

The p-type nitride semiconductor layer 25b formed on the second layer B is made of the same material as the nitride semiconductor layer 25a formed on the first region A, and is formed by the same process as the nitride semiconductor layer 25a. As mentioned above, in an actual fabrication process of a nitride semiconductor light emitting device, the active layers 24a and 24b are deposited as a single active layer on the n-type nitride semiconductor layer 23, and the p-type nitride semiconductor layers 25a and 25b are then deposited as a single p-type nitride semiconductor layer on the single active layer composed of the active layers 24a and 24b. Thereafter, the single active layer composed of the active layers 24a and 24b and the single p-type nitride semiconductor layers composed of the p-type nitride semiconductor layers 25a and 25b are each divided into two regions A and B using a specific process such as an etching process, etc.

The first region A and the second region B are separated from each other by the insulative isolation layer 26. The insulative isolation layer 26 electrically insulates the active layer 24a and the p-type nitride semiconductor layer 25a contained in the first region A from the other active layer 25b and the other p-type nitride semiconductor layer 25b contained in the second region B. Also, in the case of forming a p-type electrode 28a, the insulative isolation layer 26 prevents a material of the p-type electrode 28a from flowing between the first and second regions A and B. The insulative isolation layer 26 may be made of a material including an oxide (e.g., $SiO_2$) having electrical insulation characteristics.

An ohmic contact layer 27 is formed on the p-type nitride semiconductor layer 25a contained in the first region A. The ohmic contact layer 27 is made of a material suitable for reducing contact resistance associated with the p-type nitride semiconductor layer 25a having a relatively high energy band gap. Specifically, the ohmic contact layer 27 contained in the nitride semiconductor light emitting device used for a flipchip-structured light emitting device must be made of a specific material, which is capable of reducing contact resistance associated with the p-type nitride semiconductor layer 25a and has a high reflection factor in consideration of structural characteristics of the flipchip-structured nitride semiconductor light emitting device. In order to improve the above-mentioned contact resistance and satisfy the above-mentioned high reflection factor requirement, the ohmic contact layer 27 may be formed as at least one layer comprised of a material selected from among a specific group including a variety of materials (e.g., Ag, Ni, Al, Rh, Pd, Ir, Ru, Mg, Zn, Pt, Au) and their combination. Preferably, the ohmic contact layer 27 has a reflection factor of more than 70%. The ohmic contact layer 27 may be formed as a two-layer structure or a three-layer structure to improve the reflection efficiency. Also, the ohmic contact layer 27 may be formed by either a well-known deposition method (e.g., a CVD (Chemical Vapor Deposition) method or an E-beam evaporation method) or a sputtering process, etc., and may be heat-treated at a specific temperature of about 400° C. ~900° C. to improve ohmic contact characteristics.

The p-type electrode 28a is characterized in that it is formed on the ohmic contact layer 27 and is extended to a partial area S1 of the p-type nitride semiconductor layer 25b contained in the second region B. The p-type electrode 28a is adapted as the outermost electrode layer to be formed on a lead via a conductive bump in a flipchip structure. In the case of forming a Schottky junction, which has a nonlinear current-to-voltage characteristic and has characteristics similar to those of a diode, at a specific area S1 in contact with the p-type electrode 28a and the p-type nitride semiconductor layer 25b of the second region B, a Schottky diode is formed in the second area B. In other words, the p-type nitride semiconductor layer 25b and the n-type electrode 28b of the p-type electrode 28a contained in the second region B form a single Schottky diode.

In order to form the Schottky junction at the area S1 in contact with the p-type electrode 28a and the p-type nitride semiconductor layer 25b of the second region B, a work function of the p-type electrode 28a must be less than that of the p-type nitride semiconductor layer 25b. For example, in order to satisfy the above-mentioned work function characteristics, the p-type electrode 28a may be made of one of Ti, Cr, Al, Cu, and Au, etc. The p-type electrode 28a may be formed by a well-known deposition method such as a CVD (Chemical Vapor Deposition) method or an E-beam evaporation method, or a sputtering process, etc.

The n-type electrode 28b is spaced apart from the p-type electrode 28a, is formed on the p-type nitride semiconductor layer 25b of the second region B, passes through the p-type nitride semiconductor layer 25b and the active layer 24b contained in the second region B, and is connected to the n-type nitride semiconductor layer 23. The n-type electrode 28b may be formed as one or more layers comprised of a material selected from among a group including a variety of materials (i.e., Ti, Cr, Al, Cu, and Au), and may formed by a well-known deposition method such as a CVD (Chemical Vapor Deposition) method or an E-beam evaporation method, or a sputtering process, etc. In order to allow the n-type electrode 28b to be in contact with the n-type nitride semiconductor layer 23, the active layer 24b and the p-type nitride semiconductor layer 25b contained in the second region B are partially removed to expose the n-type nitride semiconductor layer 23 contained in a specific area, the n-type electrode 28b is formed in the exposed area so that it can be extended to the p-type nitride semiconductor layer 25b of the second region B.

The nitride semiconductor light emitting device according to the present invention extends the p-type electrode 28a to an area near to the n-type electrode 28b, so that it is preferable for a passivation layer (not shown) made of an insulative material to be formed between the p-type and n-type electrodes 28a and 28b, resulting in the prevention of the short-circuiting between the p-type and n-type electrodes 28a and 28b. In the same manner as in the insulative isolation layer 26, the passivation layer may be made of an insulative oxide such as $SiO_2$.

As described above, the present invention is characterized in that the active layers 24 and 24b are divided into the first and second regions A and B, respectively, the p-type nitride semiconductor layers 25a and 25b are also divided into the first and second regions A and B, respectively, and the p-type electrode 28a is extended to a partial area S1 of the p-type nitride semiconductor layer 25b contained in the second region B on the ohmic contact layer 27. If a suitable voltage is applied between the p-type electrode 28a and the n-type electrode 28b, a current flows in the n-type electrode 28b after sequentially passing through the p-type nitride semiconductor layer 25a, the active layer 24a, and the n-type nitride semiconductor layer 23, the light is produced in the active layer 24a contained in the first region A. In more detail, the first region A functions as a light emitting area. The p-type electrode 28a and the n-type electrode 28b in the second region B are in contact with the p-type nitride semiconductor layer 25b contained in the second region B, so that a current is unable to pass through the active layer 24b of the second region B and thereby the active layer 24b of the second region B does not produce light. In more detail, the second region B acts as a non-light-emitting area, and forms a Shottky junction, which has a nonlinear current-to-voltage characteristic and has characteristics similar to those of a diode, at a specific area S1 in contact with the p-type electrode 28a and the p-type nitride semiconductor layer 25b of the second region B, so that a Schottky diode is formed in the second area B.

In this manner, the nitride semiconductor light emitting device according to the present invention implements a light emitting diode and a diode at the same time, and is characterized in that the light emitting diode and the diode have a common electrode. The above-mentioned electrode structure can reduce the size of an overall nitride semiconductor light emitting device, and can prevent the number of electrodes from being increased because it additionally includes two electrodes for use in the light emitting diode and the other two electrodes for sue in the diode. Due to a reduced number of electrodes, the possibility of generating the short-circuiting during wire bonding is reduced. Specifically, the above-mentioned nitride semiconductor light emitting device has an advantage in that it can reduce the number of terminals needed to mount the nitride semiconductor light emitting devere to a submount using a conductive bump in a flipchip-structured light emitting device.

As can be seen from FIG. 2b, an additional diode can be implemented on a specific area where an n-type electrode of a general nitride semiconductor light emitting device(i.e., a light emitting diode having no diode) is formed, so that there is no need to increase the overall size of the nitride semiconductor light emitting diode.

Figure 2C:
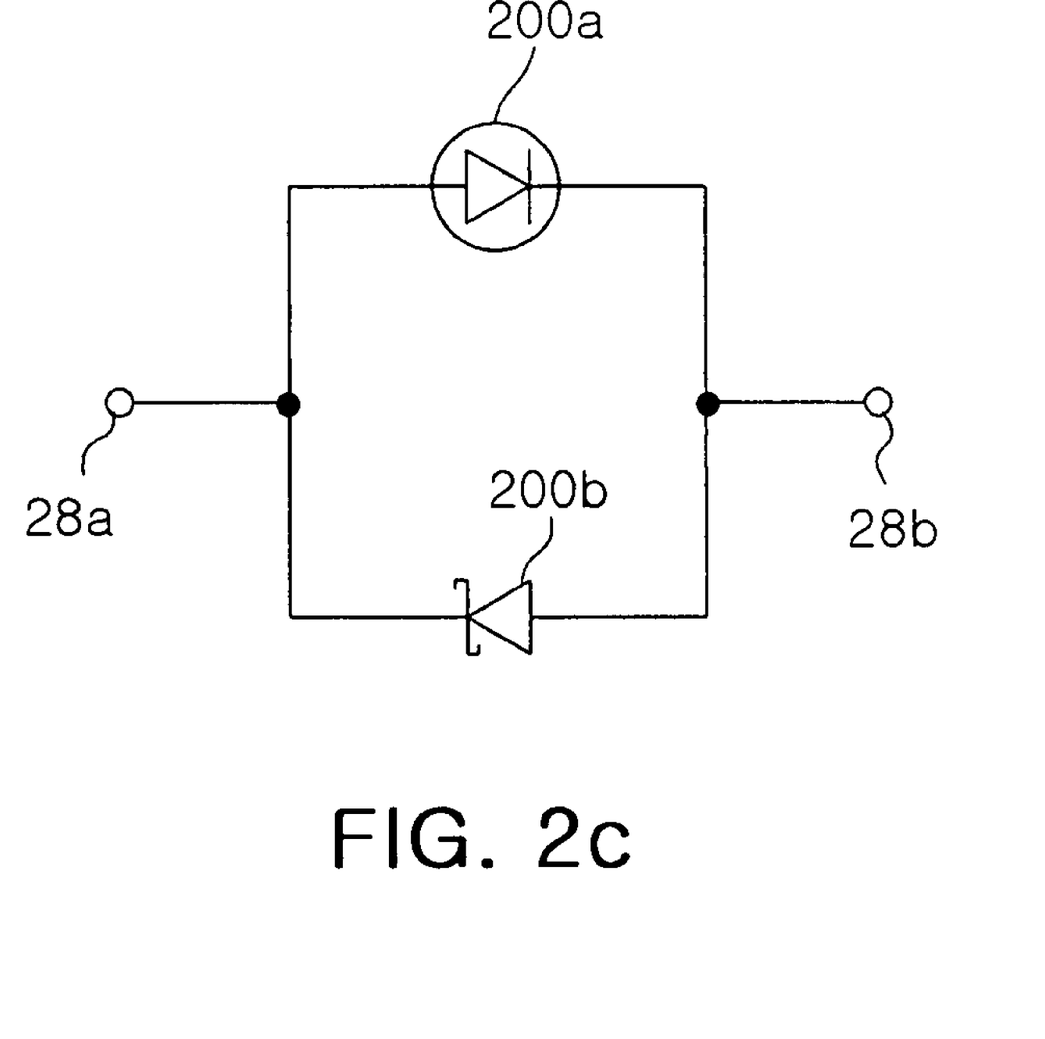
FIG. 2c is an equivalent circuit diagram illustrating the nitride semiconductor light emitting device of FIG. 2a in accordance with a preferred embodiment of the present invention.

FIG. 2c is an equivalent circuit diagram illustrating the nitride semiconductor light emitting device f FIGS. 2a~2b. As shown in FIG. 2c, the nitride semiconductor light emitting device includes a light emitting diode 200a and a Schottky diode 200b displaced between the p-type electrode 28a and the n-type electrode 28b. In this case, the light emitting diode 200a and the Schottky diode 200b are connected in parallel to each other so that they are assigned different polarities. Operations of the above-mentioned nitride semiconductor light emitting device will hereinafter be described.

If a forward voltage capable of properly operating the nitride semiconductor light emitting device is applied between the p-type electrode 28a and the n-type electrode 28b, a reverse bias is applied to the Schottky diode 200b, so that a current flows to the light emitting diode 200a, thereby emitting the light emitting diode 200a. The above-mentioned current flow is denoted by a chain-lined arrow of FIG. 2a.

If a forward voltage of several hundreds of volts is applied between the p-type electrode 28a and the n-type electrode 28b of the nitride semiconductor light emitting device, a reverse voltage, an absolute value of which is higher than that of a breakdown voltage of the Schottky diode 200b, is also applied between the p-type electrode 28a and the n-type electrode 28b, so that the Schottky diode 200b is short-circuited and most current flows in the Schottky diode 200b. Typically, the nitride semiconductor light emitting device ode may be damaged by a forward constant voltage of several hundreds of volts. The Schottky diode enters a breakdown state at a reverse voltage of several volts, so that it prevents the light emitting diode from being damaged by an excessive forward voltage generated by static electricity.

If a reverse voltage is applied between the p-type electrode 28a and the n-type electrode 28b, a forward voltage is applied to the Schottky diode 200b, so that most current flows in the Schottky diode 200b. The above-mentioned current flow is denoted by the arrow of FIG. 2a. Typically, the nitride semiconductor light emitting diode is damaged by a reverse voltage of several tens of volts, and the Schottky diode is operated by a forward bias voltage of more than 1V, resulting in a guarantee of stability in most reverse voltage applied to the light emitting diode.

In this manner, the nitride semiconductor light emitting device according to a preferred embodiment of the present invention prevents an overcurrent from flowing in the light emitting diode itself when an excessive forward voltage or reverse voltage is generated by static electricity, so that damage to the light emitting diode due to the static electricity can be prevented.

Figure 3A:
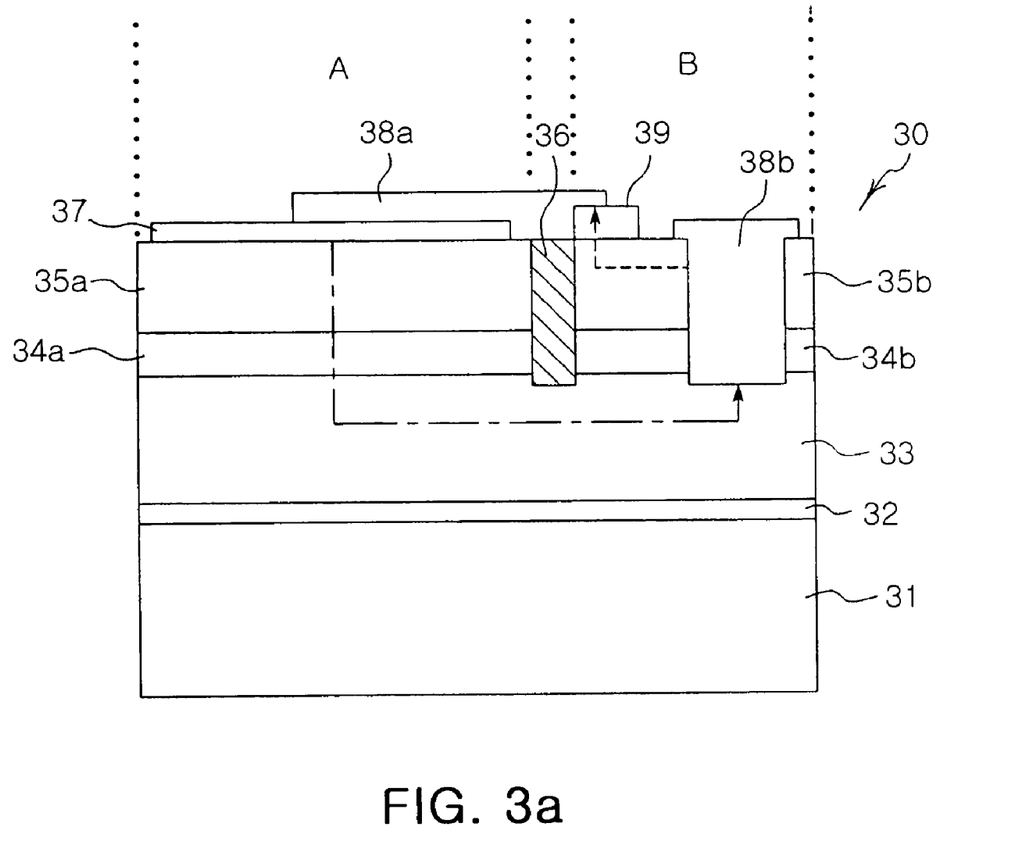
FIG. 3a is a cross-sectional view illustrating a nitride semiconductor light emitting device in accordance with another preferred embodiment of the present invention.
Figure 3B:
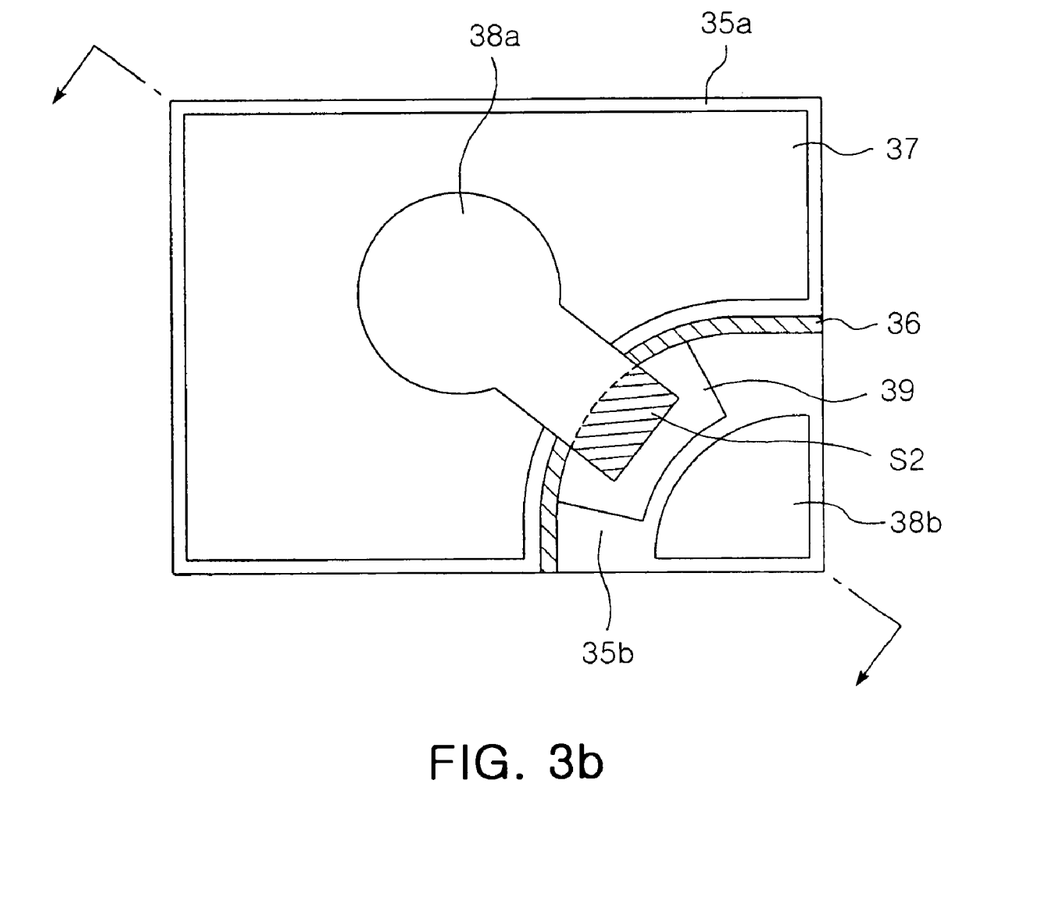
FIG. 3b is a plan view illustrating the nitride semiconductor light emitting device of FIG. 3a in accordance with another preferred embodiment of the present invention.

FIG. 3a is a cross-sectional view illustrating a nitride semiconductor light emitting device in accordance with a second preferred embodiment of the present invention. FIG. 3b is a plan view illustrating the nitride semiconductor light emitting device of FIG. 3a. The nitride semiconductor light emitting device according to the second preferred embodiment of the present invention further includes an n-type nitride semiconductor layer 39 formed between the p-type electrode 38a and the p-type nitride semiconductor layer 35b of the second region B, differently from the above-mentioned nitride semiconductor light emitting device shown in FIGS. 2a~2b. A pn-junction diode capable of forming a pn-junction between the above additional n-type nitride semiconductor layer 39 and the p-type nitride semiconductor layer 35b is formed in the second region B. In this case, it is preferable that the additional n-type nitride semiconductor layer 39 have a thickness of 50 nm~200 nm in consideration of the overall size of the nitride semiconductor light emitting device.

The Schottky diode implemented in the nitride semiconductor light emitting devise shown in FIGS. 2a~2b according to the first preferred embodiment has a disadvantage in that a leakage current is higher than that of a pn-junction diode, whereas it has an advantage in that it has a rapid reaction rate. Therefore, the second preferred embodiment in which a pn-junction having a lower leakage current is used is superior to the first preferred embodiment, because it can more efficiently prevent an electrostatic discharge from being generated as compared to the first preferred embodiment.

In an actual fabrication process, the additional n-type nitride semiconductor layer 39 can be selectively grown on a partial area of the p-type nitride semiconductor layer 35b contained in the second region B, using the same material and process as those of the n-type nitride semiconductor layer 33 formed on the substrate 31. In this case, a well-known photolithography may be adapted to selectively grow the additional n-type nitride semiconductor layer 39 on the partial area of the p-type nitride semiconductor layer 35b.

The other method capable of forming the additional n-type nitride semiconductor layer 39 will hereinafter be described. The active layers 34a and 34b are deposited as a single active layer on the n-type nitride semiconductor layer 33 formed on the substrate 31, the p-type nitride semiconductor layers 35a and 35b are deposited as a single p-type nitride semiconductor layer on the single active layer, and the additional n-type nitride layer is then deposited on the single p-type nitride semiconductor layer. The single active layer is divided into first and second regions A and B by an etching process so that two active layers 34a and 34b are formed. The single p-type nitride semiconductor layer is divided into the first and second regions A and B by the etching process so that two p-type nitride semiconductor layers 35a and 35b are formed. Then, the additional n-type nitride semiconductor layer is divided into the first and second regions A and B by the etching process. Finally, the additional n-type nitride semiconductor layer formed on the first region A is etched, and the remaining additional n-type nitride semiconductor layer other than a partial n-type nitride semiconductor layer 39 positioned at a desired location of the second region B is etched. In conclusion, the n-type nitride semiconductor layer 39 can be additionally formed at a desired location of the p-type nitride semiconductor layer 35b contained in the second region B.

Figure 3C:
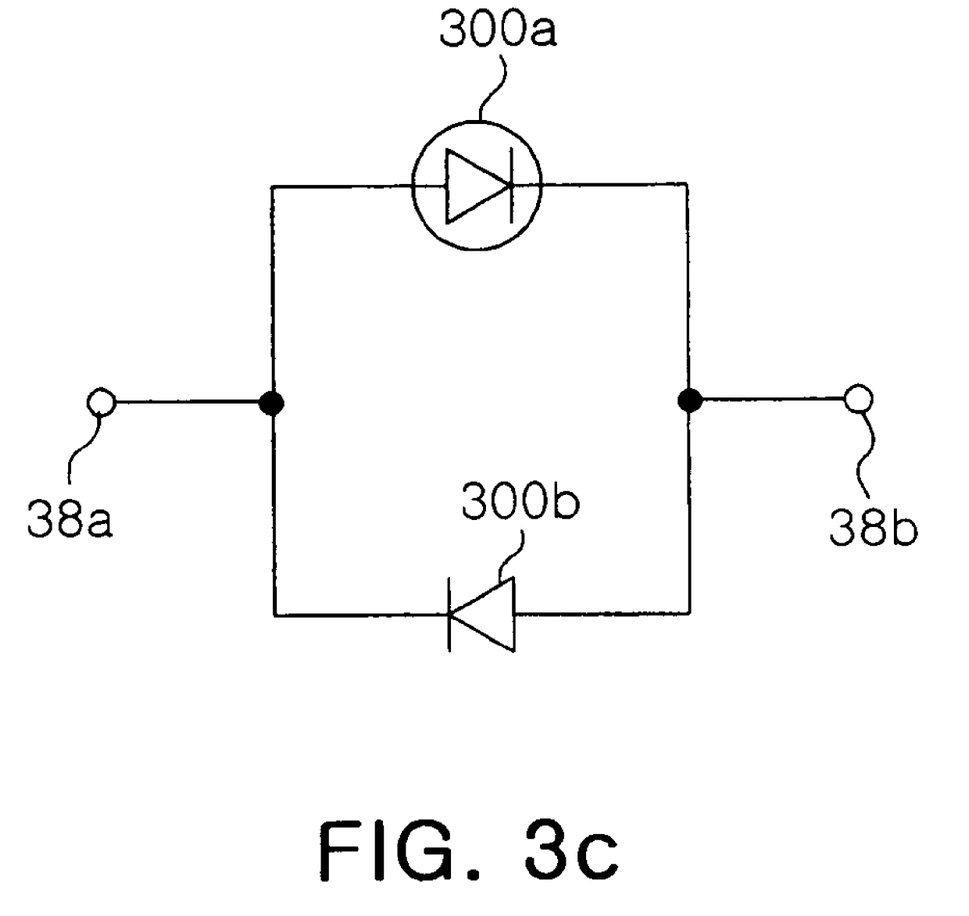
FIG. 3c is an equivalent circuit diagram illustrating the nitride semiconductor light emitting device of FIG. 3a in accordance with another preferred embodiment of the present invention.

FIG. 3c is an equivalent circuit diagram illustrating the nitride semiconductor light emitting device of FIGS. 3a~3b. In the nitride semiconductor light emitting device of FIG. 3c, the light emitting diode 300a and the pn-junction diode 300b are connected in parallel to each other so that they are assigned different polarities.

As previously stated above, a general nitride semiconductor light emitting device has characteristics in that it is damaged by a forward bias voltage of several hundreds of volts or a reverse bias voltage of several tens of volts. Therefore, a variety of operations of a nitride semiconductor light emitting device in three cases, i.e., a first case where a forward bias voltage at which the light emitting diode can be operated is applied, a second case where a forward bias voltage of several hundreds of volts is applied, and a third case where a reverse bias voltage is applied, will hereinafter be described.

If a forward voltage capable of properly operating the nitride semiconductor light emitting device 300a is applied between the p-type electrode 38a and the p-type electrode 38b, a reverse bias is applied to the pn-junction diode 300b, so that a current flows to the light emitting diode 300a, thereby emitting the light emitting diode 300a. Generally, an absolute value of the forward bias voltage capable of operating the light emitting diode 300a is equal to or less than an absolute value of a breakdown voltage of the pn-junction diode, so that most current flows in the light emitting diode 300a. The above-mentioned current flow is denoted by a chain-lined arrow of FIG. 3a.

If a forward voltage of several hundreds of volts is applied between the p-type electrode 38a and the n-type electrode 38b of the nitride semiconductor light emitting device, a reverse voltage, an absolute value of which is higher than that of a breakdown voltage of the pn-junction diode 300b, is also applied between the p-type electrode 38a and the n-type electrode 38b, so that the pn-junction diode 300b enters a breakdown state and is almost short-circuited. Therefore, most current flows in the pn-junction diode 300b, so that the pn-junction diode 300b can prevent the light emitting diode from being damaged by an excessive forward voltage caused by static electricity.

If a reverse voltage is applied between the p-type electrode 38a and the n-type electrode 38b, a forward voltage is applied to the pn-junction diode 300b, so that most current flows in the pn-junction diode 300b. The above-mentioned current flow is denoted by the arrow of FIG. 3a. Therefore, the above-mentioned nitride semiconductor light emitting device can guarantee stability in most reverse voltage applied to the nitride semiconductor light emitting device itself.

Figure 4:
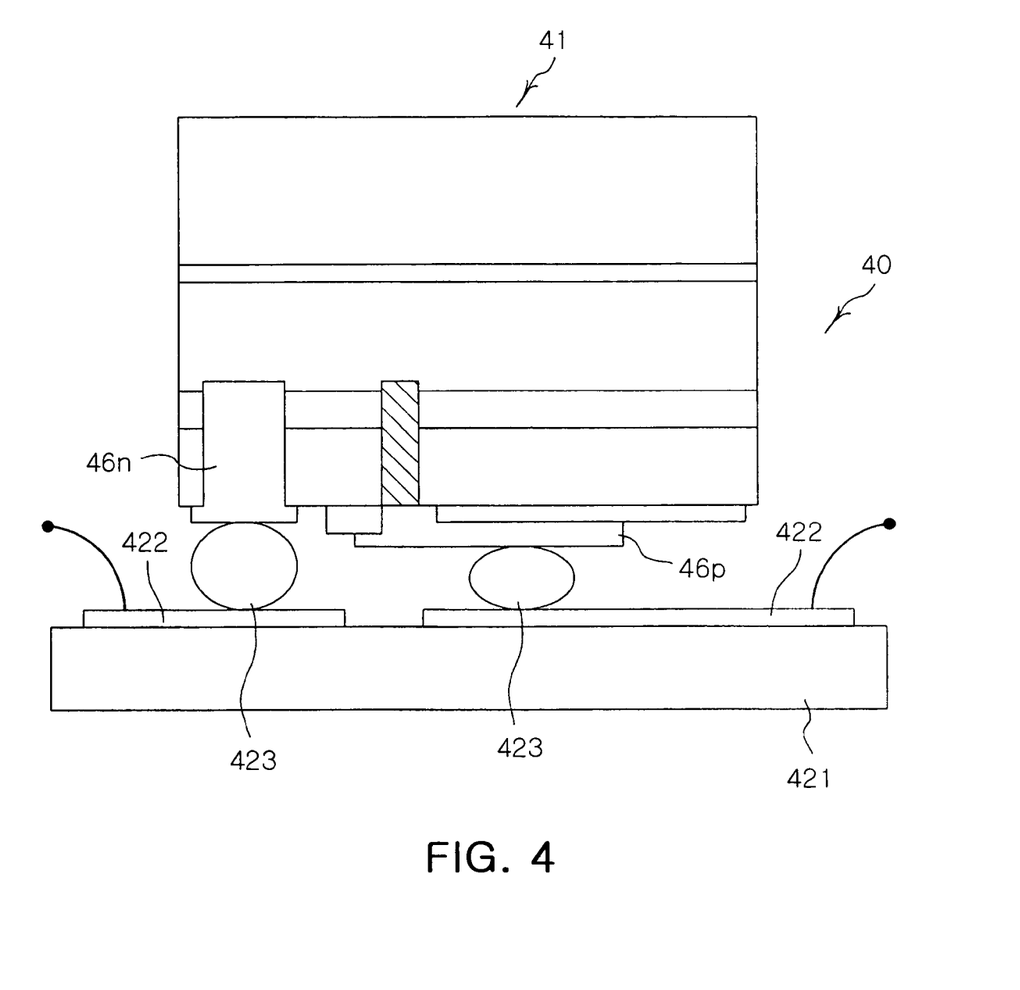
FIG. 4 is an example of a flipchip-structured light emitting device including a nitride semiconductor light emitting device in accordance with the present invention.

The nitride semiconductor light emitting devoice according to the present invention simultaneously implements a light emitting diode and a diode on a single substrate, is designed to prevent the light emitting diode from being damaged by static electricity, and is designed to have an electrode structure easily applied to a flipchip-structured light emitting device. FIG. 4 shows a specific example in which the nitride semiconductor light emitting device is applied to the flipchip-structured light emitting device in accordance with the present invention.

Typically, a substrate for use in the nitride semiconductor light emitting device an electrically insulative substrate, so that the p-type and n-type electrodes contained in the final nitride semiconductor light emitting device are formed on the same surface of the substrate. The above-mentioned structural characteristics allow the nitride semiconductor light emitting device to have unique characteristics by which the nitride semiconductor light emitting device can be easily applied to the flipchip structure.

The nitride semiconductor light emitting device according to the present invention has a characteristic electrode structure in which a light emitting diode and a diode that are formed on a single substrate use a common electrode. Therefore, as shown in FIG. 4, a nitride semiconductor light emitting device 41 according to the present invention welds individual electrodes 46p and 46n to individual lead patterns 422 positioned on a substrate 421 acting as a supporter via a conductive bump 423 in the same manner as in a general nitride semiconductor light emitting device (i.e., a single light emitting diode having no diode), such that the nitride semiconductor light emitting device 41 can be mounted to the substrate 421.

The nitride semiconductor light emitting device according to the present invention uses only two electrodes, whereas the conventional nitride semiconductor light emitting device including a diode requires four electrodes by including two electrodes in each of a light emitting diode and the diode, so that the nitride semiconductor light emitting device according to the present invention simplifies its connection structure, and can also simplify a lead pattern structure formed on a substrate acting as a supporter in a flipchip structure.

Although the insulative isolation layers shown in FIGS. 2b and 3b are each extended from one face of a nitride semiconductor light emitting device to the other face thereof, it should be noted that the present invention is not limited to the above-mentioned examples shown in FIGS. 2b and 3b, and individual shapes of the insulative isolation layers can be modified in various ways according to the shape of the n-type electrode or the size of the nitride semiconductor light emitting devie by those skilled in the art.

As apparent from the above description, the present invention simultaneously implements a nitride semiconductor light emitting diode and a diode on a single substrate without increasing the size of an overall nitride semiconductor light emitting device, such that it can prevent the light emitting diode from being damaged by static electricity.

Also, the nitride semiconductor light emitting device according to the present invention allows the light emitting diode and the diode formed on the single substrate to use a common electrode, so that it is capable of being operated by only two electrodes, and is capable of solving the problem caused by an additional electrode connected to an external circuit, for example, a short-circuiting problem. Specifically, the nitride semiconductor light emitting device can be more readily connected to a lead pattern formed on a substrate acting as a supporter when being applied to a flipchip structure.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A nitride semiconductor light emitting device, comprising:
    a first n-type nitride semiconductor layer formed on a substrate;
    an active layer and a p-type nitride semiconductor layer which are sequentially formed on the first n-type nitride semiconductor layer, are each divided into a first region and a second region by an insulative isolation layer;
    an ohmic contact layer formed on the p-type nitride semiconductor layer contained in the first region;
    a p-type electrode which is formed on the ohmic contact layer, and is extended to the p-type nitride semiconductor layer contained in the second region; and
    an n-type electrode which is spaced apart from the p-type electrode, is formed on the p-type nitride semiconductor layer contained in the second region, passes through the p-type nitride semiconductor layer and the active layer contained in the second region, and is connected to the first n-type nitride semiconductor layer.

2. The nitride semiconductor light emitting device according to claim 1, wherein the p-type electrode has a work function less than that of the p-type nitride semiconductor layer.

3. The nitride semiconductor light emitting device according to claim 1, wherein the p-type electrode is made of a material selected from among a group comprised of Ti, Cr, Al, Cu, and Au.

4. The nitride semiconductor light emitting device according to claim 1, further comprising:
    a second n-type nitride semiconductor layer additionally formed between the p-type nitride semiconductor layer of the second region and the p-type electrode.

5. The nitride semiconductor light emitting device according to claim 4, wherein the second nitride semiconductor layer is designed to have a thickness of 50 nm~200 nm.

6. The nitride semiconductor light emitting device according to claim 1, wherein the ohmic contact layer has a reflection factor of more than 70%.

7. The nitride semiconductor light emitting device according to claim 1, wherein the ohmic contact layer includes at least one layer made of a material selected from among a group comprised of Ag, Ni, Al, Rh, Pd, Ir, Ru, Mg, Zn, Pt, Au, and their combination.

* * * * *